United States Patent
Abraham et al.

(10) Patent No.: US 6,420,864 B1
(45) Date of Patent: Jul. 16, 2002

(54) MODULAR SUBSTRATE MEASUREMENT SYSTEM

(75) Inventors: Michael Abraham, Mainz (DE); Ivo J. M. M. Raaijmakers, Bilthoven (NL); Alain Gaudon, Launac; Pierre Astegno, Saint Jory, both of (FR)

(73) Assignees: Nanophotonics AG, Mainz (DE); Recif SA, Aussonne (FR)

( * ) Notice: Subject to any disclaimer, the term of this patent is extended or adjusted under 35 U.S.C. 154(b) by 0 days.

(21) Appl. No.: 09/548,773

(22) Filed: Apr. 13, 2000

(51) Int. Cl.[7] .............................................. G01R 31/26
(52) U.S. Cl. ................................... 324/158.1; 324/765
(58) Field of Search ............................ 324/158.1, 765; 414/225, 222, 744.5, 217; 118/719; 29/25.01; 438/5

(56) References Cited

U.S. PATENT DOCUMENTS

| | | | |
|---|---|---|---|
| 4,501,527 A | | 2/1985 | Jacoby et al. |
| 4,722,298 A | | 2/1988 | Rubin et al. |
| 4,881,863 A | * | 11/1989 | Braginsky .................... 414/225 |
| 5,076,205 A | * | 12/1991 | Vowles et al. ............... 118/719 |
| 5,288,379 A | * | 2/1994 | Namiki et al. .......... 204/192.12 |
| 5,310,039 A | * | 5/1994 | Butera et al. ............. 198/346.2 |
| 5,310,410 A | * | 5/1994 | Begin et al. ................ 29/25.01 |
| 5,407,449 A | * | 4/1995 | Zinger ........................ 29/25.01 |
| 5,488,292 A | * | 1/1996 | Tsuta ........................ 324/158.1 |
| 5,494,494 A | * | 2/1996 | Mizuno et al. ............. 29/25.01 |
| 5,742,158 A | * | 4/1998 | Itoh ......................... 324/158.1 |
| 5,779,799 A | | 7/1998 | Davis |
| 5,798,651 A | * | 8/1998 | Aruga et al. ................. 324/754 |
| 5,851,296 A | * | 12/1998 | Haraguchi et al. .......... 118/719 |
| 5,863,170 A | * | 1/1999 | Boitnott et al. ............. 414/222 |
| 5,882,165 A | * | 3/1999 | Maydan et al. .............. 414/217 |
| 5,897,710 A | * | 4/1999 | Sato et al. ....................... 438/5 |
| 6,053,980 A | * | 4/2000 | Suda et al. .................. 118/719 |
| 6,075,358 A | * | 6/2000 | Hetzel et al. ............. 324/158.1 |
| 6,113,694 A | * | 9/2000 | Davis .......................... 118/663 |
| 6,143,083 A | * | 11/2000 | Yonemitsu et al. .......... 118/719 |
| 6,205,368 B1 | * | 3/2001 | Hirahara et al. ....... 4141/744.5 |
| 6,206,974 B1 | * | 3/2001 | Iida et al. ................... 118/719 |

FOREIGN PATENT DOCUMENTS

| | | |
|---|---|---|
| WO | WO 91/04213 | 4/1991 |
| WO | WO 99/18603 | 4/1999 |
| WO | WO 99/49500 | 9/1999 |

* cited by examiner

*Primary Examiner*—Safet Metjahic
*Assistant Examiner*—Jimmy Nguyen
(74) *Attorney, Agent, or Firm*—Knobbe, Martens, Olson & Bear, LLP

(57) ABSTRACT

Substrate measurement system including a measurement chamber (30), and a substrate handling chamber (7) possessing substrate transfer means (10) and a substrate container interface (1) arranged to receive a substrate container (8), the handling chamber (7) containing an interface (50) to connect the measurement chamber (30), the measurement chamber (30) containing an interface (51) to connect to the handling chamber (7), and the transfer means (10) being arranged to transfer substrates between the container (8) and the measurement chamber (30) through the handling chamber (7), in which a second measurement chamber (39) is provided, having the same interface (51) as the first measurement chamber (30) to replace the latter chamber (30).

10 Claims, 5 Drawing Sheets

MODULAR SUBSTRATE MEASUREMENT SYSTEM

FIELD OF THE INVENTION

The invention relates to an assembly of a substrate measurement system.

PRIOR ART

Such a cluster tool is known from WO 99/49500, in which, in order to reduce cycle time overhead, an inspection tool (e.g. a optical microscope) and one or more review tools (e.g. a scanning electron microscope and/or an atomic force microscope) are linked by an automation platform that handles wafer transport between the tools and a substrate container interface. Although the cluster tool is designed to be optimised with respect to the throughput from one tool (e.g. inspection) to another (e.g. one of the provided review tools), the flexibility of the cluster in terms of maintenance and repair of one of the tools is low: in such a case the complete cluster will be out of order. Also, flexibility in terms of reconfiguring a cluster tool on-site for a different type of wafer analysis, by just a simple replacement of the measurement tools is low.

It is the objective of the present invention to provide a solution for these problems by a more flexible arrangement of the measurement tools and the substrate transfer means involved.

SUMMARY OF THE INVENTION

The present invention relates to an assembly of a substrate measurement system in which a second measurement chamber is provided, which fits within the same dimensions as a first measurement chamber. Further, the second measurement chamber is provided with the same identical interface as the first measurement chamber to replace the first measurement chamber.

The present invention provides a substrate measurement system comprising a central substrate handling chamber which is provided with substrate transfer means, at least one substrate container interface with a standardised interface and arranged to receive a matching substrate container, and a mechanical interface to receive a measurement chamber comprising a measurement instrument. The measurement chamber has a standardised size and is provided with standardised mechanical interface, in order to connect to the corresponding interface of the substrate handling chamber. Because of the standardisation of the measurement chamber, the modular substrate measurement system can easily be configured with different types of measurement instruments for a certain application by a simple replacement of one measurement chamber by another chamber.

According to a preferred embodiment of the present invention, the central substrate handling chamber comprises two or more measurement chambers of standardised size and provided with a standardised mechanical interface. In this embodiment, the substrate transfer means are shared by the two or more measurement instruments inside their respective measurement chambers and the substrate container interface, resulting in savings in cost and floor space. Moreover, two or more measurements on a single wafer can be executed sequentially without time delay. In this embodiment, more than one substrate container interface can be connected to the substrate handling chamber. The measurement chambers can be distributed in a substantially horizontal plane but they can also be stacked in a substantially vertical direction.

According to a further embodiment of the present invention, the substrate measurement system comprises a substrate container stocker system arranged to store a plurality of substrate containers, each containing a batch of wafers awaiting measurements, and substrate container transfer means. The substrate container transfer means transfer substrate containers between the stocker system and the substrate container interface of the substrate handling chamber. In this manner, a further increase in efficiency is possible by providing a wafer storage buffer in the stocker system. Due to the physical separation of the functionality of process tools and measurements tools, the delay times in both the process tools and the measurement tools may be reduced since their respective cycle times are no longer dependent on each other.

According to a further embodiment of the present invention, the substrate container interfaces and the mechanical interface of the substrate handling chamber arranged to connect to a measurement chamber are standardised, so that at choice a station can receive either a substrate container or a measurement chamber. In this way, the flexibility of a modular substrate measurement system is increased even further. The system can be adapted to specific needs within a short time. Also, replacement and repair of a measurement chamber containing a defective measurement instrument may be strongly simplified due to the modularity of the system.

BRIEF DESCRIPTION OF FIGURES

Below, the invention will be explained with reference to the drawings, which are intended for illustration purposes only and not to limit the scope of protection as defined in the accompanying claims.

DESCRIPTION OF PREFERRED EMBODIMENTS

Figure 1:
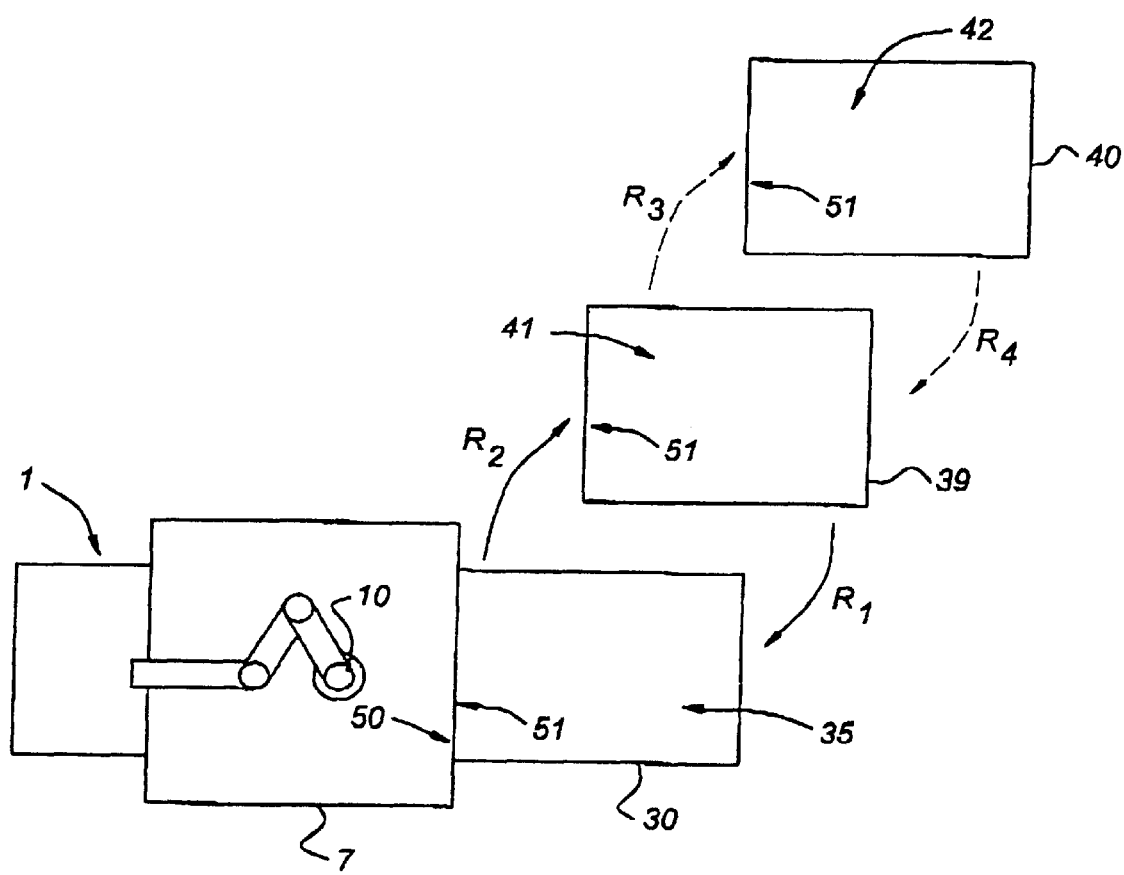
FIG. 1 is a schematic top view diagram showing a substrate measurement system according to a first embodiment.

FIG. 1 shows a substrate measurement system comprising a centrally mounted substrate handling chamber 7, provided with wafer transfer means 10. The substrate handling chamber is provided with a substrate container interface 1 and a mechanical interface 50 on which a measurement chamber 30 is connected. Substrate container interface 1 is connected to substrate handling chamber 7. On substrate container interface 1 a substrate container 8 is mounted. Substrate container interface 1 provides a standardised mechanical interface on which the substrate container 8 is connected by means of a corresponding interface.

In measurement chamber 30 a measurement instrument 35 is provided for a certain application, e.g. measurement of the thickness of a film on a wafer. Both substrate handling chamber 7 and measurement chamber 30 comprise standardised mechanical interfaces: due to the standardised mechanical interface 50 provided on the substrate handling chamber 7 and the matching interface 51 on the measurement chamber 30, the measurement chamber 30 can easily be replaced by another measurement chamber such as 39 or 40, each provided with its respective measurement instrument 41 or 42, specific to their desired application. The replacement of measurement chambers is schematically indicated in FIG. 1 by arrows R1, R2, R3 and R4.

Figure 2:
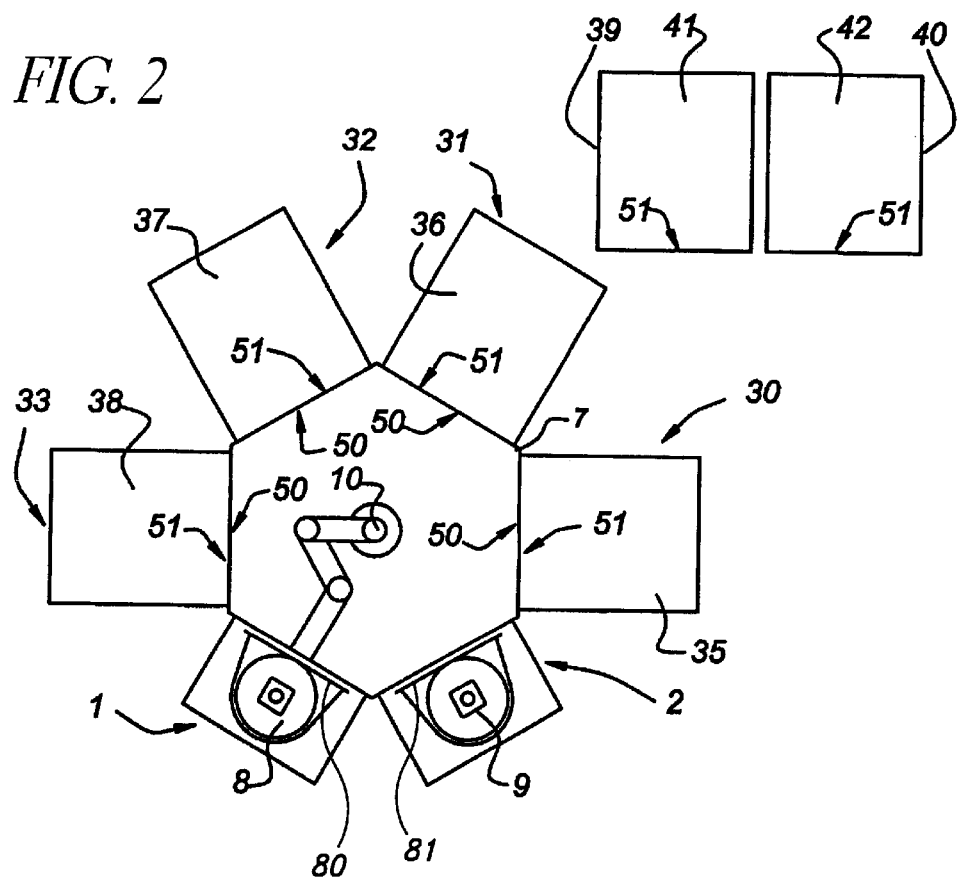
FIG. 2 is a schematic top view diagram showing a substrate measurement system according to a second embodiment.

FIG. 2 shows a second embodiment of the present invention of a substrate measurement system wherein a plurality of stations is distributed in a substantially horizontal plane around a centrally mounted substrate handling chamber 7, provided with wafer transfer means 10. The substrate handling chamber has the shape of a regular hexagon, but other shapes, including shapes with less or more sides, and/or irregular shapes are also possible. Two substrate container interfaces 1 and 2 are shown with substrate container 8 and 9 installed on substrate container interface 1 and 2, respectively. Four measurement chambers 30, 31, 32, 33 are shown, each connected to substrate handling chamber 7. The measurement chambers 30, 31, 32, 33 comprise a respective measurement instrument 35, 36, 37 and 38, specific to the application of each measurement chamber. The measurement chambers 30, 31, 32, 33 have standardised dimensions and standardised mechanical interfaces 51 matching the standardised interfaces 50 of the substrate handling chamber 7 in such a manner that any of the measurement chambers 30, 31, 32 or 33, can be interchangeably mounted on any one position of the measurement chambers 30, 31, 32 or 33.

The substrate transfer means are capable of transferring a substrate from any of the substrate containers 8, 9, located on substrate container interfaces 1, 2, by means of their interfaces 80, 81, in any required sequence along any number of the measurement chambers 30, 31, 32, 33 and of returning the substrate in either, the same substrate container or the other substrate container, respectively.

During measurement of a substrate in any of the measurement instruments 35, 36, 37, 38, located in one of the measurement chambers 30, 31, 32, 33, the substrate can be supported by the substrate transfer means 10. But, most preferably, the substrate is supported on substrate support means (not shown) inside the measurement chamber 35, 36, 37, 38 and the substrate transfer means 10 are retracted from the measurement chamber 30, 31, 32, 33. In this way, during measurement of one substrate in one measurement instrument, the substrate transfer means 10 is available to transfer other substrates to and from one of the other measurement instruments.

The substrate handling chamber 7 can also be equipped with a station for substrate aligning or for substrate identification, as known in the art. Alternatively, one of the measurement chambers can be equipped with a station for substrate aligning and/or for substrate identification. When two or more substrate container interfaces 1, 2 are provided, one of the substrate containers could be used for substrates that are rejected on the basis of the results of the measurement(s) performed on them.

In the embodiment of FIG. 2, each measurement chamber 30, 31, 32, 33 can easily be replaced by one of a plurality of other measurement chambers 39, 40, that are each provided with its respective measurement instrument 41 or 42, specific to the desired application.

Figure 3:
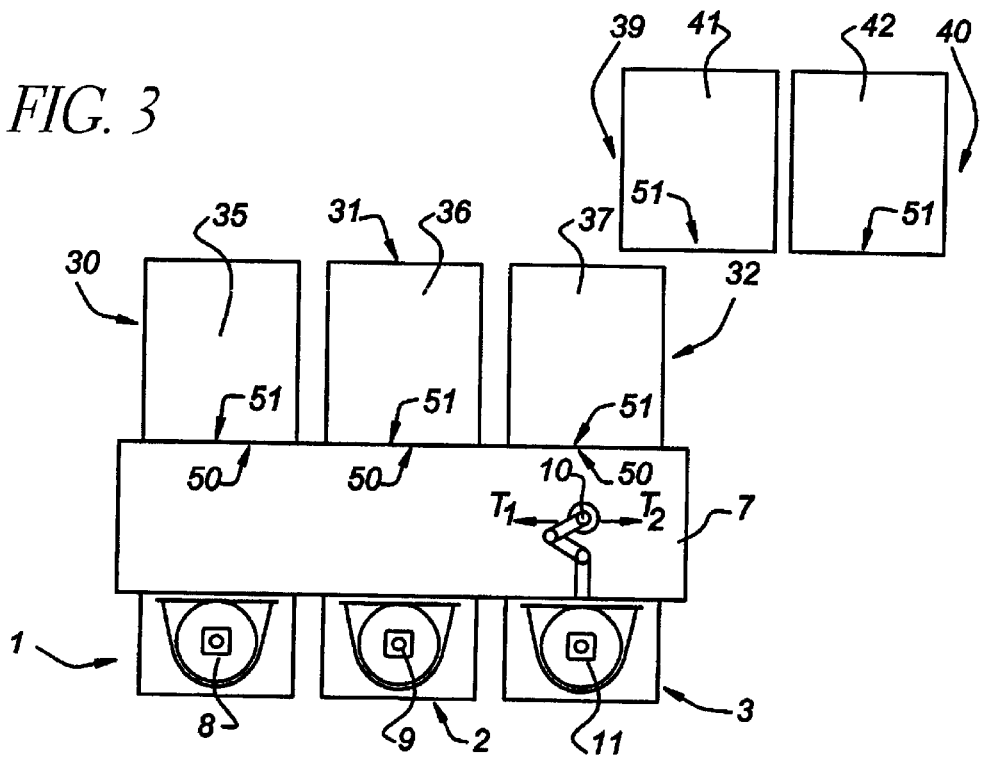
FIG. 3 is a schematic top view diagram showing a substrate measurement system according to a third embodiment.

FIG. 3 shows a modular substrate measurement system according to a third embodiment wherein the substrate container interfaces 1, 2, 3 and the measurement chambers 30, 31 32 are grouped in linear arrays around an elongated substrate handling chamber 7. Between substrate handling chamber and measurement chambers, mechanical interfaces 50 and 51 are provided as described in the previous embodiments. On the substrate container interfaces 1, 2, 3 substrate containers 8, 9, 11 are mounted. The substrate transfer means 10 comprise means for a linear translation in the substantially longitudinal direction of the substrate handling chamber 7, as indicated by the arrows T1 and T2.

In the embodiment of FIG. 3, due to the standardised mechanical interfaces 50 and 51, each measurement chamber 30, 31, 32 can easily replaced by one of a plurality of other measurement chambers 39, 40, that are each provided with its respective measurement instrument 41 or 42, specific to the desired application. Also, due to the standardised mechanical interfaces 50 and 51, the measurement chambers 30, 31, 32 can be mutually exchanged in any way selected.

Figure 4A:
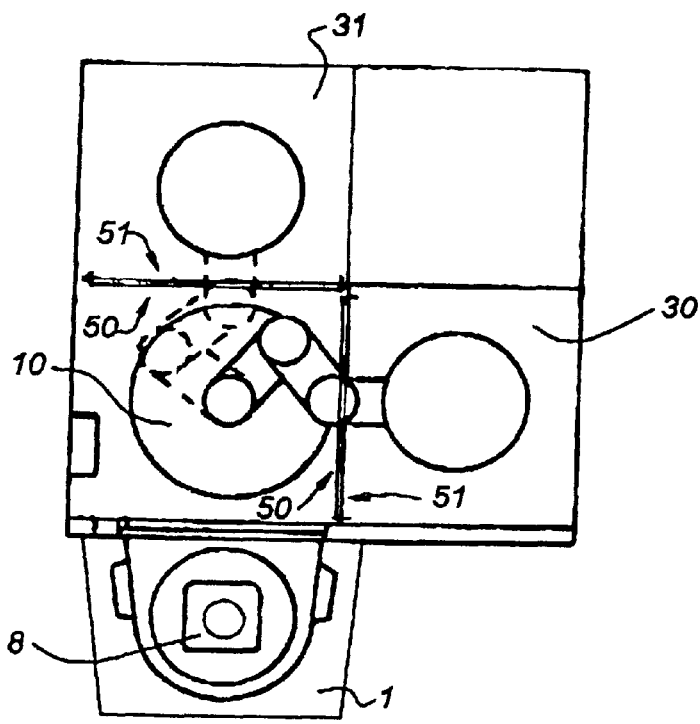
FIG. 4a is an exploded perspective view of a substrate measurement system according to the fourth embodiment.
Figure 4B:
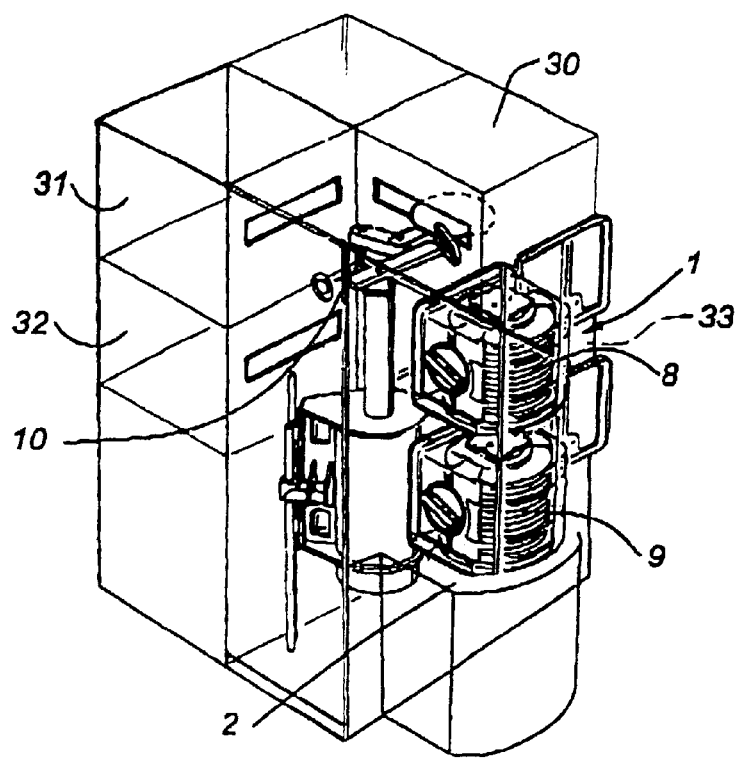
FIG. 4b is a schematic top view diagram showing a substrate measurement system according to a fourth embodiment.

FIGS. 4a and 4b show a substrate measurement system according to a fourth embodiment. As shown in FIG. 4a in an exploded perspective view of this embodiment, two substrate container interfaces 1, 2 are provided, stacked on each other in a vertical direction. Substrate containers 8, 9 are mounted on their respective substrate container interfaces 1, 2. Measurement chambers 30, 31, 32, 33 provided with measurement instruments 35, 36, 37, 38 are linked to a central substrate handling chamber 7, by means of the standard mechanical interfaces 51 on the chambers 30, 31, 32 and one of the corresponding interfaces 50 of the chamber 7. The measurement chambers are distributed here both in a substantially horizontal and a substantially vertical direction. The measurement chamber 30 is next to the station 31 at a right angle. The chamber 31 is on top of the chamber 32, and the chamber 30 is on top of the chamber 33 (not visible).

In this embodiment, the substrate transfer means 10 of substrate handling chamber 7 is capable of transferring substrates to and from stations 1, 2, 30, 31, 32, 33 both in a substantially horizontal and a substantially vertical direction.

In FIG. 4b a top view of this embodiment of the present invention is shown. The measurement chambers 30 and 31 are located at a 90° angle with respect to their front sides. It is to be understood that any other suitable angle between the measurement chambers can be used as well.

In the embodiment of FIGS. 4a and 4b, due to the standardised mechanical interfaces 50 and 51, each measurement chambers 30, 31, 32, 33 can easily replaced by one of a plurality of other measurement chambers 39, 40 (not shown), that are each provided with its respective measurement instrument 41 or 42, specific to the desired application. Also, due to the standardised mechanical interfaces 50 and 51, the measurement chambers 30, 31, 32, 33 can be mutually exchanged in any way selected.

Figure 5A:
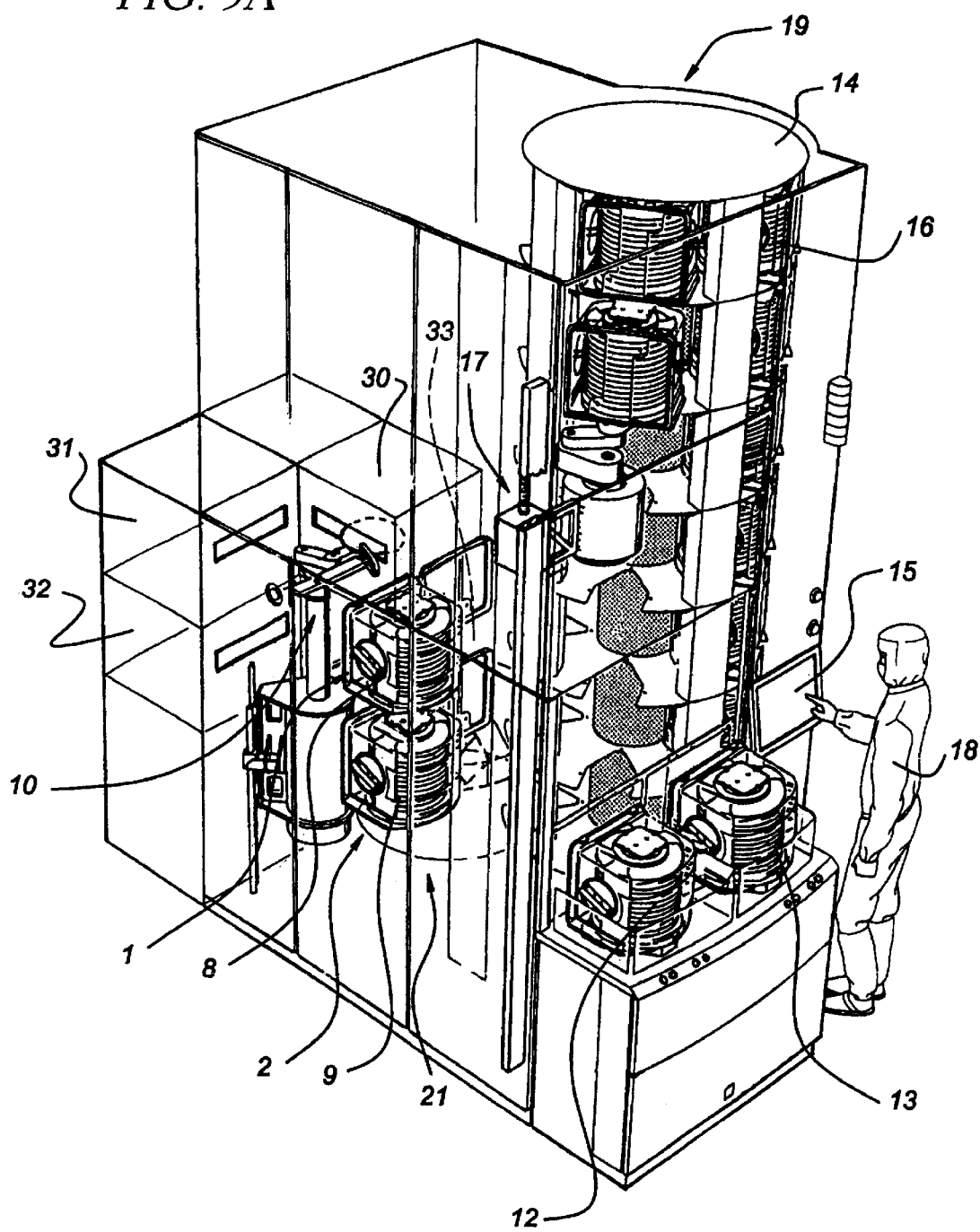
FIG. 5a is an exploded perspective view of a substrate measurement system according to the fifth embodiment.
Figure 5B:
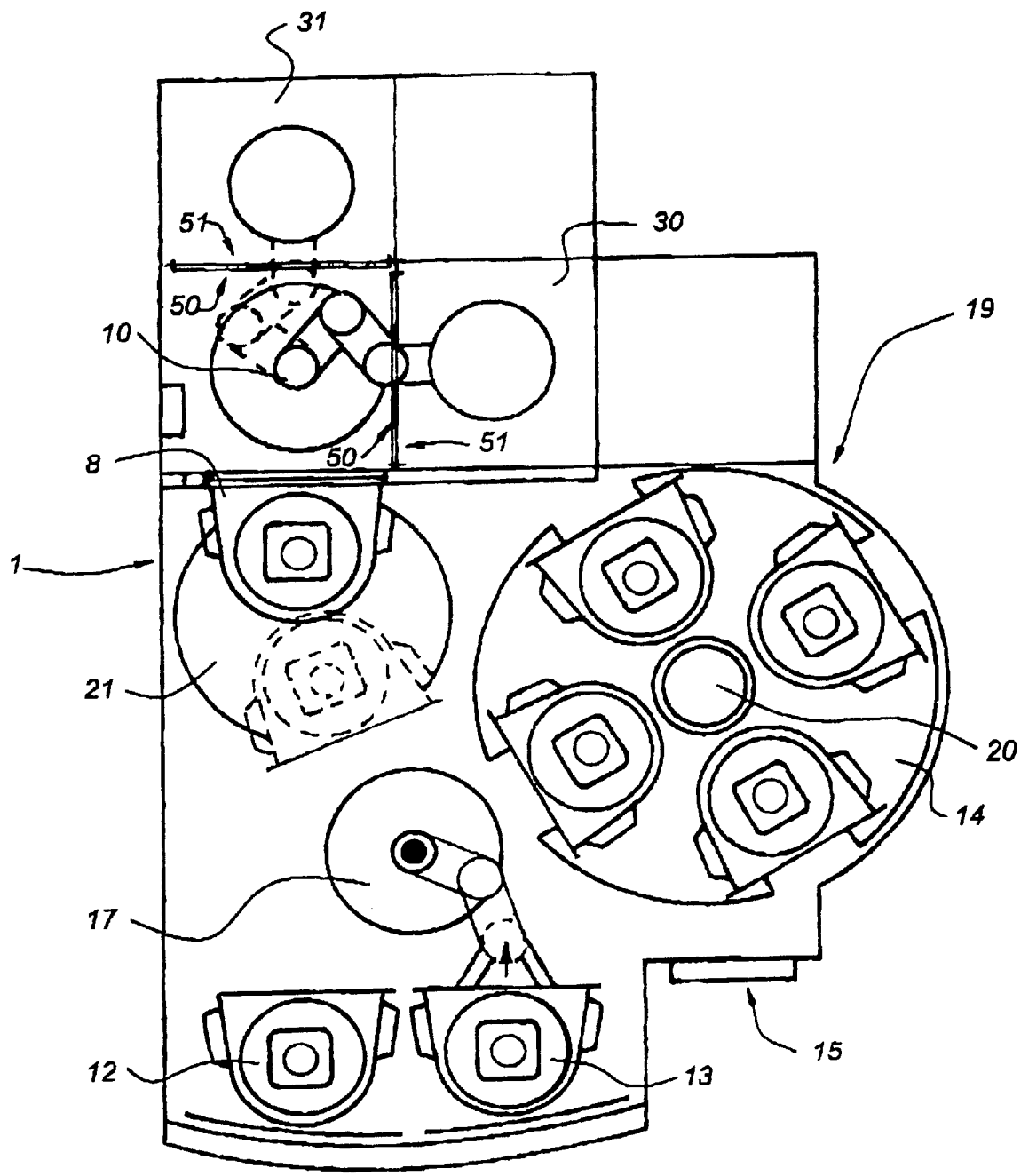
FIG. 5b is a schematic top view diagram showing a substrate measurement system according to a fifth embodiment.

FIGS. 5a and 5b show the substrate measurement system according to a fifth embodiment, wherein the substrate measurement system is provided with a substrate container stocker and substrate container transfer means to transfer substrate container between the substrate container stocker and the substrate container interfaces. As shown in FIG. 5a in an exploded perspective view of this embodiment, two substrate container interfaces 1, 2 are provided, stacked on each other in a vertical direction. Substrate containers 8, 9 are mounted on their respective substrate container interfaces 1, 2. Measurement chambers 30, 31, 32, 33 provided with measurement instruments 35, 36, 37, 38 are linked to a central substrate handling chamber 7, by means of the standard mechanical interfaces 51 on the stations 30, 31, 32 and one of the corresponding interfaces 50 of the chamber 7. The measurement chambers are distributed here both in a substantially horizontal and a substantially vertical direction. The measurement chamber 30 is next to the chamber 31 at a right angle. The chamber 31 is on top of the chamber 32, and the chamber 30 is on top of chamber 33 (not visible).

In this embodiment, the substrate transfer means 10 of substrate handling chamber 7 is capable of transferring substrates to and from stations 1, 2, 30, 31, 32 both in a substantially horizontal and a substantially vertical direction.

Substrate containers 8, 9 mounted on the substrate container interfaces 1, 2, are transferred to and from the substrate container stocker 19 by transfer means 17 and 21. In the substrate container stocker 19, substrate containers are stored in a carrousel 14 which comprises a plurality of storage shelves 16. Each shelf 16 can rotate around a central axis 20 in the carrousel and can contain a number of substrate containers. The substrate container stocking means 17 can transfer containers in both a substantially horizontal and substantially vertical direction to each certain locations in the carrousel. Substrate containers can be entered in the system by means of the substrate container entrance stations 12, 13 which provide interfaces for mounting substrate containers which can be simplified as compared to the substrate container interfaces 1 and 2. The transfer means 17 and 21 transfer the substrate containers from the substrate container entrance stations 12 and 13 to the substrate container stocker 19. Also, the transfer means 17 and 21 can transfer a substrate container directly from a substrate container entrance station 12, 13 to a substrate container interface 1, 2 and vice versa.

As is known in the art, it is possible to provide just one entrance station 12 or more than two entrance stations. An operator 18 can monitor and operate the system by means of a control unit comprising means for displaying and entering commands, like e.g. a touch screen 15. The control unit may comprise other means (not shown) as required for its function, as is known in the art.

Alternatively, the substrate container stocker may comprise a linear storeroom, in which containers are stored on rectangular shelves instead of inside the carrousel 14, and linear substrate container transfer means instead of the substrate container transfer means 17 and 21.

In the embodiment of FIGS. 5a and 5b, due to the standardisation of the mechanical interfaces 50 and 51, each measurement chamber 30, 31, 32, 33 can easily replaced by one of a plurality of other measurement chambers 39, 40 (not shown), that are each provided with its respective measurement instrument 41 or 42, specific to the desired application. Also, due to the standardised mechanical interfaces 50 and 51, the measurement chambers 30, 31, 32, 33 can be mutually exchanged in any way selected.

The substrate handling chamber 7 can have a dust-free air atmosphere but also a controlled or protective atmosphere of an inert gas like nitrogen $N_2$ or a noble gas like argon Ar may be provided. Alternatively, it is possible to have the substrate handling chamber 7 evacuated. In that case, the substrate container interfaces 1, 2, 3 provide a loadlock to transfer substrates from the substrate containers 8, 9, 11 to and from vacuum.

Similarly, the measurement instrument 35, 36, 37, 38 may require specific atmospheric conditions like a protective ambient (nitrogen or argon), or vacuum. In that case, the measurement chamber 30, 31, 32, 33 and/or the substrate handling chamber 7 provide means to supply, maintain and confine the ambient within the measurement chamber.

It will be understood that the measurement instrument 35, 36, 37, 38 as mounted on the measurement chamber 30, 31, 32, 33 comprises the essential parts to facilitate the measurement. However, other parts like e.g. a power supply, a vacuum pump, or a computer system linked to a measurement instrument, can be mounted at some distance of the measurement instrument 35, 36, 37, 38 and/or the measurement chamber 30, 31, 32, 33, as will be known to persons skilled in the art. These other parts may be physically located remote from the substrate measurement system, if required.

It will be understood that, in particular when the sensor of the measurement instrument is small, a measurement chamber can comprise more than one sensor.

It will also be clear that for the first three embodiments the stations can also be stacked in a substantially vertical direction.

Typically one desires to perform measurements at a number of locations spread over the substrate surface area. This can be realised by translating the substrate in two horizontal and orthogonal directions. However, this requires a lot of space: about two times the dimension of the substrate in both directions. By keeping the dimensions of each measurement chamber small the modularity of the system can be exploited to the full extent by connecting a plurality of measurement chambers to the substrate handling chamber while keeping the overall dimensions of the system within acceptable limits. To this end, the measurement chambers 30–33, 39, 40 are preferably provided with rotating means to rotate the substrate support means which support the substrate. In the measurement chamber 30–33, 39, 40 a sensor of a measurement instrument 35–38, 41, 42 is provided with sensor transfer means to translate the sensor relative to the substrate, in order to facilitate substrate mapping measurements.

The sensor transfer means may provide a linear displacement of the sensor, for example in a horizontal direction, perpendicular to the interface 51, or diagonally across the measurement chamber 30–33, 39, 40. Also, for example, the sensor transfer means may provide a displacement of the sensor in a horizontal direction along a curved trace, when the sensor is attached to a sensor transfer means that can rotate around a mounting point.

Alternatively, the measurement sensor can be mounted at a fixed position within the measurement chamber 30–33, 39, 40. In that case, the substrate support means are provided with support transfer means to displace the substrate relative to the sensor in a horizontal direction, preferably in the direction in which loading/unloading of the substrate takes place.

Also, it may be possible that sensor transfer means and support transfer means are provided which can displace both the measurement sensor and the substrate relative to each other, in two horizontal and orthogonal directions.

In this way the outside dimensions of the measurement chamber need to be only slightly larger than the dimensions of the substrate to allow mapping of the wafer. When the substrate is circular, with a diameter of 300 mm or greater, the measurement chamber can fit within a horizontal square or rectangular cross section with the smallest dimension less than 100 mm larger than the substrate diameter. For the compactness of the system it is advantageous to have this smallest dimension at the side that is mounted against the substrate handling chamber.

What is claimed is:

1. Assembly of a substrate measurement system comprising a first measurement chamber, and a substrate handling chamber provided with substrate transfer means and a substrate container interface for receiving a substrate container, said substrate handling chamber being provided with a mechanical interface to connect to the first measurement chamber, said first measurement chamber comprising a measurement instrument and being provided with a mechanical interface to connect to said substrate handling chamber, and said substrate transfer means being arranged to transfer substrates between said substrate container and said first measurement chamber through said substrate handling chamber, > a second measurement chamber being provided, which fits within the same dimensions as said first measurement chamber and is provided with the same identical interface as said first measurement chamber to replace said first measurement chamber.

2. Assembly of a substrate measurement system according to claim 1, wherein said second measurement chamber is one of a set of measurement chambers.

3. Assembly of a substrate measurement system according to claim 1, wherein said substrate handling chamber comprises two interfaces to connect two of said first measurement chambers.

4. Assembly of a substrate measurement system according to claim 1, wherein said assembly comprises at least two substrate container interfaces.

5. Assembly of a substrate measurement system according to claim 1, wherein said substrate container interfaces, said mechanical interface of said substrate handling chamber are identical so that each of said interfaces can connect at choice either to the interface of a substrate container or to the mechanical interface of a measurement chamber.

6. Assembly of a substrate measurement system according to claim 4, wherein at least one of said substrate container interfaces receives said substrate container from a substrate container storage system by a transfer means.

7. Assembly of a substrate measurement system according to claim 1, in which any of said first measurement chambers, said substrate containers and said substrate handling chamber is arranged to be gastight sealable.

8. Assembly of a substrate measurement system according to claim 1, wherein said substrate container comprises a closed housing with a removable door and, to connect to said substrate container interface, a mechanical interface which sealably engages with said housing, and said substrate container interface comprises a mechanism arranged to engage with and remove/relocate said removable door.

9. Assembly of a substrate measurement system according to claim 1, wherein said first and second measurement chambers are capable of receiving a substrate, with said substrate being transferred in or out the measurement chamber by said substrate transfer means and said measurement chambers being provided with substrate support means arranged to support said substrate, rotating means arranged to rotate said substrate support means, in order to facilitate substrate mapping measurements, and transfer means to displace the substrate support means of the measurement instrument relative to a sensor of the measurement instrument.

10. Assembly of a substrate measurement system according to claim 1, wherein said first and second measurement chambers are capable of receiving a substrate, with said substrate being transferred in or out the measurement chamber by said substrate transfer means and said measurement chambers being provided with substrate support means arranged to support said substrate, rotating means arranged to rotate said substrate support means, in order to facilitate substrate mapping measurements, and transfer means to displace the substrate support means of the measurement instrument relative to a sensor of the measurement instrument.

* * * * *